(12) United States Patent
Lee

(10) Patent No.: US 7,151,058 B2
(45) Date of Patent: Dec. 19, 2006

(54) ETCHANT FOR ETCHING NITRIDE AND METHOD FOR REMOVING A NITRIDE LAYER USING THE SAME

(75) Inventor: Sang-Mi Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/879,203

(22) Filed: Jun. 30, 2004

(65) Prior Publication Data

US 2004/0266210 A1 Dec. 30, 2004

(30) Foreign Application Priority Data

Jun. 30, 2003 (KR) ............... 10-2003-0043306

(51) Int. Cl.
*H01L 21/302* (2006.01)
*H01L 21/461* (2006.01)
(52) U.S. Cl. ............... 438/757; 438/748; 257/E21.251
(58) Field of Classification Search ............... 438/757, 438/748; 257/E21.245, E21.251
See application file for complete search history.

(56) References Cited

U.S. PATENT DOCUMENTS 5,635,303 A * 6/1997 Retallick ............... 428/472.2

6,517,738 B1 * 2/2003 Torek et al. ............... 252/79.1
2001/0046760 A1 * 11/2001 Chatterjee et al. ............ 438/585
2003/0171075 A1 * 9/2003 Nihonmatsu et al. ......... 451/41

FOREIGN PATENT DOCUMENTS

| JP | 10284467 | * 10/1998 |
| JP | 2002-353120 | 12/2002 |
| KR | 100252212 B1 | 1/2000 |
| KR | 1020010038794 A | 5/2001 |
| WO | WO 01/67509 A1 | 9/2001 |

\* cited by examiner

*Primary Examiner*—Caridad Everhart
(74) *Attorney, Agent, or Firm*—Volentine Francos & Whitt, PLLC

(57) ABSTRACT

In a method for removing a nitride layer of a semiconductor device, an etchant including about 15 to about 40 percent by volume of hydrofluoric acid, about 15 to about 60 percent by volume of phosphorous acid, and about 25 to about 45 percent by volume of deionized water is prepared. The etchant is provided onto a nitride layer that is formed on a bevel, a front side or a backside of a substrate to remove the nitride layer. The substrate is rinsed using deionized water, and then the substrate is dried. The etchant rapidly removes the nitride layer at a relatively low temperature to avoid damage to the substrate.

14 Claims, No Drawings

ETCHANT FOR ETCHING NITRIDE AND METHOD FOR REMOVING A NITRIDE LAYER USING THE SAME

BACKGROUND OF THE INVENTION

1. Field of the Invention

The present invention generally relates to the manufacture of semiconductor devices. More particularly, the present invention relates to an etchant for etching nitride and to a method for removing a nitride layer of a semiconductor device using the etchant.

A claim of priority under 35 USC § 119 is made to Korean Patent Application No. 2003-43306, filed on Jun. 30, 2003, the contents of which are herein incorporated by reference in their entirety for all purposes.

2. Description of the Related Art

The manufacture a semiconductor device typically includes a number of repeatedly performed processes of forming various layers and etching the layers to obtain desired patterns. Further, the layers or the patterns are often treated in some manner to realize certain material characteristics. These processes can adversely result in the generation of unwanted particles.

The particles may be generated from a semiconductor fabricating equipment, and from layers positioned on a backside and a bevel of a processed semiconductor substrate. As the particles generated from the layers positioned on the backside and the bevel of the semiconductor substrate have become more significant, an etchant for removing the layers has been studied.

As described above, processes for manufacturing a semiconductor device are repeatedly carried out. The actual substrate processed in a given process is treated for inspecting conditions of the substrate. For example, to inspect a thickness and a property of a layer formed on the actual substrate and a capacitance of a semiconductor device, the inspection process is performed on a dummy substrate that is loaded into a process line with the actual substrate.

After the inspection process is completed, a process for removing a layer that is formed on the dummy substrate is carried out on the dummy substrate. Then, the dummy substrate may be reused or discarded. Since the cost of the substrate has increased as the substrate size of the substrate exceeds 300 mm, the dummy substrate has been more often reused than discarded.

The removing process removes the layer on the substrate using an etchant. Accordingly, an etchant for etching the layer without damaging the substrate is in demand. To effectively remove the layer, the etchant is selected in accordance with material characteristics of the layer.

The layers formed on the backside and the bevel of the substrate may include polysilicon, nitride and oxide. Particularly, the layer may mainly include nitride. Unnecessary nitride remaining on the backside and the bevel of the substrate is removed using the etchant. The etchant for removing nitride varies in accordance with processes. For example, the etchant for removing nitride that is formed on the bevel of the substrate may include a phosphorous acid ($H_3PO_4$) solution. The etchant for removing the layer that is formed on the dummy substrate may include a hydrofluoric acid (HF) solution.

However, the time for removing nitride or the layer is so long so using the phosphorous acid solution and the hydrofluoric acid solution that these solutions are not desirable. Furthermore, atoms contained in the phosphorous acid solution or the hydrofluoric acid solution are chemically reacted with each other at a high temperature which can cause damage to the substrate. For example, the phosphorous acid solution removes nitride too slow at a relatively low temperature of about 160° C. The hydrofluoric acid solution removes the layer including nitride proportional to a temperature increase of the hydrofluoric acid solution. Fumes may be generated in the removal process using the hydrofluoric acid solution such that the semiconductor fabricating equipment may be damaged.

As above-mentioned, although nitride may be rapidly removed at a high temperature, the substrate may be thermally damaged due to the high temperature such that particles are generated from the damaged substrate. On the contrary, a time for removing nitride may be too long when the conventional etchant is used at a low temperature.

SUMMARY OF THE INVENTION

The present invention provides an etchant for rapidly and effectively etching nitride.

The present invention also provides a method for removing a nitride layer of a semiconductor device, which rapidly removes a nitride layer positioned on a bevel of a semiconductor substrate to prevent nitride contained in the nitride layer from absorbing on the bevel of the substrate.

The present invention still further provides a method for removing a nitride layer of a semiconductor device, which rapidly removes a nitride layer positioned on a backside of a semiconductor substrate to prevent nitride contained in the nitride layer from absorbing on the backside of the substrate.

The present invention yet further provides a method for removing a nitride layer of a semiconductor device, which rapidly removes a nitride layer formed on a front side of a semiconductor substrate to prevent nitride contained in the nitride layer from absorbing on the front side of the substrate.

In accordance with one aspect of the present invention, there is provided an etchant for etching nitride including about 15 to about 40 percent by volume of hydrofluoric acid, about 15 to about 60 percent by volume of phosphorous acid and about 25 to about 45 percent by volume of deionized water.

In accordance with another aspect of the present invention, there is provided a method for removing a nitride film of a semiconductor device. In the method, an etchant including about 15 to about 40 percent by volume of hydrofluoric acid, about 15 to about 60 percent by volume of phosphorous acid and about 25 to about 45 percent by volume of deionized water is provided. The etchant is provided onto a nitride layer formed on a bevel of a substrate at a temperature of about 50° C. to about 90° C. to remove the nitride layer. After the substrate is rinsed using deionized water, the substrate is dried.

In accordance with still another aspect of the present invention, there is provided a method for removing a nitride film of a semiconductor device. In the method, an etchant including about 15 to about 40 percent by volume of hydrofluoric acid, about 15 to about 60 percent by volume of phosphorous acid and about 25 to about 45 percent by volume of deionized water is provided. The etchant is provided to a nitride layer formed on a backside of a substrate at a temperature of about 50° C. to about 90° C. to remove the nitride layer. The substrate is rinsed using deionized water, and then dried.

In accordance with still another aspect of the present invention, there is provided a method for removing a nitride film of a semiconductor device. In the method, an etchant including about 15 to about 40 percent by volume of hydrofluoric acid, about 15 to about 60 percent by volume of phosphorous acid and about 25 to about 45 percent by volume of deionized water is provided. The etchant is provided to a nitride layer formed on a front side of a substrate at a temperature of about 50° C. to about 90° C. to remove the nitride layer. The substrate is rinsed using deionized water, and then dried.

DETAILED DESCRIPTION OF THE PREFERRED EMBODIMENTS

Hereinafter, the present invention now will be described more fully. This invention may, however, be embodied in many different forms and should not be construed as limited to the embodiments set forth herein; rather, these embodiments are provided so that this disclosure will be thorough and complete, and will fully convey the scope of the invention to those skilled in the art. It will be understood that when an element such as a layer, region or substrate is referred to as being "on" or "onto" another element, it can be directly on the other element or intervening elements may also be present.

An etchant for etching nitride in accordance with the present invention is primarily illustrated.

The etchant includes about 15 to about 40 percent by volume of hydrofluoric acid, about 15 to about 60 percent by volume of phosphorous acid, and about 25 to about 45 percent by volume of deionized water.

When the amount of hydrofluoric acid in the etchant is less than about 15 percent by volume, an etching rate of the nitride may decrease. On the contrary, when the amount of hydrofluoric acid is above about 40 percent by volume, fumes may be generated from nitride. Thus, the amount of hydrofluoric acid is preferably about 15 to about 40 percent by volume, more preferably, about 28 to about 40 percent by volume based on the total volume of the etchant.

When the amount of phosphorous acid is less than about 15 percent by volume, the hydrofluoric acid may adversely increase to an amount that is greater than is preferable as described above. On the contrary, when the amount of phosphorous acid is more than about 60 percent by volume, the amount of hydrofluoric acid may be less than is preferable as described above. Thus, the amount of phosphorous acid preferably is about 15 to about 60 percent by volume, more preferably, about 15 to about 35 percent by volume based on the total volume of the etchant.

The etchant preferably is applied at a temperature of about 50° C. to about 90° C. At this temperature range, an excellent nitride etching rate is realized. Most preferably, the etchant temperature is about 75° C.

A method for removing a nitride film of a semiconductor device using the etchant of the present invention is described below.

The method for removing a nitride film formed on a bevel of a substrate is primarily illustrated. Nitride is coated on the bevel of the substrate to form a nitride layer. The nitride layer may have a thickness substantially identical to that of a general insulating interlayer.

An etchant including about 15 to about 40 percent by volume of hydrofluoric acid, about 15 to about 60 percent by volume of phosphorous acid, and about 25 to about 45 percent by volume of deionized water is prepared. The etchant is provided onto the nitride layer at a temperature of about 50° C. to about 90° C. Here, the etchant may be sprayed on the nitride layer while the substrate rotates. The etchant is spread from a central portion of the substrate to an edge portion of the substrate by a centrifugal force generated from the rotative substrate to effectively remove the nitride layer remaining on the bevel of the substrate.

The substrate is rinsed using deionized water to remove the etchant remaining on the substrate. The substrate is then dried to remove the deionized water.

Alternatively, the etchant applied to the nitride layer may include about 28 to about 40 percent by volume of hydrofluoric acid and about 15 to about 35 percent by volume of phosphorous acid, and may be provided at a temperature of about 50° C. to about 75° C.

A method for removing a nitride film formed on a backside of a substrate is described next.

Nitride is coated on a backside of a substrate to form a nitride layer. The nitride layer may have a thickness substantially identical to that of a general insulating interlayer.

An etchant including about 15 to about 40 percent by volume of hydrofluoric acid, about 15 to about 60 percent by volume of phosphorous acid, and about 25 to about 45 percent by volume of deionized water is prepared. The etchant is provided onto the nitride layer at a temperature of about 50° C. to about 90° C. Here, the etchant may be sprayed on the nitride layer. Alternatively, the substrate may be immersed in a bath in which the etchant is contained.

The substrate is rinsed using deionized water to remove the etchant remaining on the substrate. The substrate is dried to remove the deionized water.

Alternatively, the etchant including about 28 to about 40 percent by volume of hydrofluoric acid and about 15 to about 35 percent by volume of phosphorous acid may be provided onto the nitride layer at a temperature of about 50° C. to about 75° C.

A method for removing a nitride film formed on a front side of a substrate is described next.

Nitride is coated on a front side of a substrate to form a nitride layer. The nitride layer may have a thickness substantially identical to that of a general insulating interlayer.

An etchant including about 15 to about 40 percent by volume of hydrofluoric acid, about 15 to about 60 percent by volume of phosphorous acid, and about 25 to about 45 percent by volume of deionized water is prepared. The etchant is provided onto the nitride layer at a temperature of about 50° C. to about 90° C. Alternatively, the substrate may be immersed in a bath in which the etchant is contained.

The substrate is rinsed using deionized water to remove the etchant remaining on the substrate. The substrate is dried to remove the deionized water.

Alternatively, the etchant including about 28 to about 40 percent by volume of hydrofluoric acid and about 15 to about 35 percent by volume of phosphorous acid may be provided onto the nitride layer at a temperature of about 50° C. to about 75° C.

EXAMPLE 1

Hydrofluoric acid, phosphorous acid and deionized water were mixed to prepare an etchant. The etchant included an amount of about 31.42 percent by volume of hydrofluoric acid, an amount of about 31.57 percent by volume of phosphorous acid, and an amount of about 37.01 percent by volume of deionized water. An amount of hydrofluoric acid was about 50 by weight percents, and an amount of phosphorous acid was about 85 by weight percents.

A nitride layer having a thickness of about 3,600 Å was formed on a substrate. The etchant was provided onto the nitride layer at a temperature of about 60° C. for about 1 minute.

EXAMPLE 2

Hydrofluoric acid, phosphorous acid and deionized water were mixed to prepare an etchant. The etchant included an amount of about 18.75 percent by volume of hydrofluoric acid, an amount of about 53.12 percent by volume of phosphorous acid, and an amount of about 28.13 percent by volume of deionized water. An amount of hydrofluoric acid was about 50 by weight percents, and an amount of phosphorous acid was about 85 by weight percents.

A nitride layer having a thickness of about 3,600 Å was formed on a substrate. The etchant was provided onto the nitride layer at a temperature of about 70° C. for about 1 minute.

EXAMPLE 3

Hydrofluoric acid, phosphorous acid and deionized water were mixed to prepare an etchant. The etchant included an amount of about 30.76 percent by volume of hydrofluoric acid, an amount of about 32.69 percent by volume of phosphorous acid, and an amount of about 36.55 percent by volume of deionized water. An amount of hydrofluoric acid was about 50 by weight percents, and an amount of phosphorous acid was about 85 by weight percents.

A nitride layer having a thickness of about 3,600 Å was formed on a substrate. The etchant was provided onto the nitride layer at a temperature of about 70° C. for about 1 minute.

EXAMPLE 4

Hydrofluoric acid, phosphorous acid and deionized water were mixed to prepare an etchant. The etchant included an amount of about 33.33 percent by volume of hydrofluoric acid, an amount of about 28.33 percent by volume of phosphorous acid, and an amount of about 38.34 percent by volume of deionized water. An amount of hydrofluoric acid was about 50 by weight percents, and an amount of phosphorous acid was about 85 by weight percents.

A nitride layer having a thickness of about 3,600 Å was formed on a substrate. The etchant was provided onto the nitride layer at a temperature of about 70° C. for about 1 minute.

Comparative Example 1

Hydrofluoric acid and deionized water were mixed to prepare an etchant. The etchant included an amount of about 41.66 percent by volume of hydrofluoric acid and an amount of about 58.34 percent by volume of deionized water. An amount of hydrofluoric acid was about 50 by weight percents.

A nitride layer having a thickness of about 3,600 Å was formed on a substrate. The etchant was provided onto the nitride layer at a temperature of about 50° C. for about 1 minute.

Comparative Example 2

Hydrofluoric acid, phosphorous acid and deionized water were mixed to prepare an etchant. The etchant included an amount of about 18.75 percent by volume of hydrofluoric acid, an amount of about 53.12 percent by volume of phosphorous acid, and an amount of about 28.13 percent by volume of deionized water. An amount of hydrofluoric acid was about 50 by weight percents, and an amount of about 85 by weight percents of phosphorous acid.

A nitride layer having a thickness of about 3,600 Å was formed on a substrate. The etchant was provided onto the nitride layer at a temperature of about 50° C. for about 1 minute.

Comaparative Example 3

Hydrofluoric acid, phosphorous acid and deionized water were mixed to prepare an etchant. The etchant included an amount of about 30.76 percent by volume of hydrofluoric acid, an amount of about 32.69 percent by volume of phosphorous acid, and an amount of about 36.55 percent by volume of deionized water. An amount of hydrofluoric acid was about 50 by weight percents, and an amount of phosphorous acid was about 85 by weight percents.

A nitride layer having a thickness of about 3,600 Å was formed on a substrate. The etchant was provided onto the nitride layer at a temperature of about 50° C. for about 1 minute.

Comparative Example 4

Hydrofluoric acid, phosphorous acid and deionized water were mixed to prepare an etchant. The etchant included an amount of about 33.33 percent by volume of hydrofluoric acid, an amount of about 28.33 percent by volume of phosphorous acid, and an amount of about 38.34 percent by volume of deionized water. An amount of hydrofluoric acid was about 50 by weight percents, and an amount of phosphorous acid was about 85 by weight percents.

A nitride layer having a thickness of about 3,600 Å was formed on a substrate. The etchant was provided onto the nitride layer at a temperature of about 50° C. for about 1 minute.

Comparative Example 5

Hydrofluoric acid, phosphorous acid and deionized water were mixed to prepare an etchant. The etchant included an amount of about 13.63 percent by volume of hydrofluoric acid, an amount of about 61.81 percent by volume of phosphorous acid, and an amount of about 24.56 percent by volume of deionized water. An amount of hydrofluoric acid was about 50 by weight percents, and an amount of phosphorous acid was about 85 by weight percents.

A nitride layer having a thickness of about 3,600 Å was formed on a substrate. The etchant was provided onto the nitride layer at a temperature of about 70° C. for about 1 minute.

Comparative Example 6

Hydrofluoric acid, phosphorous acid and deionized water were mixed to prepare an etchant. The etchant included an amount of about 13.63 percent by volume of hydrofluoric acid, an amount of about 61.81 percent by volume of phosphorous acid, and an amount of about 24.56 percent by volume of deionized water. An amount of hydrofluoric acid was about 50 by weight percents, and an amount of phosphorous acid was about 85 by weight percents.

A nitride layer having a thickness of about 3,600 Å was formed on a substrate. The etchant was provided onto the nitride layer at a temperature of about 50° C. for about 1 minute.

Comparative Example 7

Hydrofluoric acid and deionized water were mixed to prepare an etchant. The etchant included an amount of about 25 percent by volume of hydrofluoric acid and an amount of about 75 percent by volume of deionized water. An amount of hydrofluoric acid was about 50 by weight percents, and an amount of deionized water was about 75 by weight percents.

A nitride layer having a thickness of about 3,600 Å was formed on a substrate. The etchant was provided onto the nitride layer at a temperature of about 30° C. for about 1 minute.

Comparative Example 8

Phosphorous acid and deionized water were mixed to prepare an etchant. The etchant included an amount of about 85 percent by volume of phosphorous acid, and an amount of about 15 percent by volume of deionized water. An amount of phosphorous acid was about 85 by weight percents, and an amount of deionized water was about 15 by weight percents.

A nitride layer having a thickness of about 3,600 Å was formed on a substrate. The etchant was provided onto the nitride layer at a temperature of about 160° C. for about 13 minute. An SC-1 solution was provided onto the substrate at a temperature of about 70° C. Here, the SC-1 solution included about 1.2 percent by volume of $NH_4OH$, about 4.8 percent by volume of $H_2O_2$, and about 94 percent by volume of deionized water.

Comparing an Etching Rate in Accordance with Etchants

Each thickness of the nitride layers formed on the substrate was measured. The nitride layers were etched using the etchants according to Examples 1 to 4 and Comparative Examples 1 to 8. Each thickness of the remaining nitride layers was measured to obtain the etched thickness of the nitride layers. Further, times for etching the nitride layers were measured to obtain etching rates. The obtained etching rates are shown in Table 1.

TABLE 1

|  | Etching rate (Å/min) |
|---|---|
| Example 1 | 1,824 |
| Example 2 | 2,062 |
| Example 3 | 3,022 |
| Example 4 | 3,550 |
| Comparative Example 1 | 1,469 |
| Comparative Example 2 | 728 |
| Comparative Example 3 | 1,070 |
| Comparative Example 4 | 1,275 |
| Comparative Example 5 | 1,335 |
| Comparative Example 6 | 561 |
| Comparative Example 7 | 300 |
| Comparative Example 8 | 61.6 |

As shown in Table 1, the etching rates in Examples 1 to 4 were above about 1,800 Å/min. On the contrary, the etching rates in Comparative Examples 1 to 6 were below about 1,500 Å/min.

The nitride layers were etched under substantially the same conditions except for the temperatures in Examples 2 to 4 and Comparative Examples 2 to 4. The etching rates in Examples 2 to 4 were about three times faster than those in Comparative Examples 2 to 4, respectively. It could be noted that the etching rates were different according to the temperatures, although the nitride layers were etched using the etchants having substantially the same composition ratio.

On the contrary, the etching rates in Comparative Examples 5 and 6 where the etchants having a composition ratio below than those of the present invention were used were slow although the nitride layers were etched at a relatively high temperature. That is, when the concentration of hydrofluoric acid contained in the etchant was greater than or equal to predetermined volume percents, desired etching rates were acquired. Thus, an amount of hydrofluoric acid was above about 15 percent by volume. However, although an amount of hydrofluoric acid was about 24 percent by volume in Comparative Example 7, the etching rate was very slow due to the low temperature.

Since an amount of hydrofluoric acid was about 41.66 percent by volume in Comparative Example 1, a relatively rapid etching rate was obtained. The etchant according to Comparative Example 1 was inappropriate for an etching process because fumes that may damage equipment might be generated from the etchant proportionally as the amount of hydrofluoric acid might increase. The fumes might damage the equipment proportional to the increase in the temperature.

Accordingly, it could be noted that an amount of hydrofluoric acid was preferably below about 40 percent by volume. As a result, an amount of hydrofluoric acid was advantageously about 15 to about 40 percent by volume. More advantageously, an amount of hydrofluoric acid was about 28 to about 40 percent by volume. An amount of phosphorous acid was preferably about 15 to about 60 percent by volume on the base of the entire etchant. More preferably, an amount of phosphorous acid was about 15 to about 35 percent by volume.

The etching rate in Comparative Example 8 was the slowest among Comparative Examples. Thus, it could be noted that the etchant preferably had a predetermined volume percents of hydrofluoric acid.

Accordingly, the etchant of the present invention removed the nitride layer having a thickness of above 3,500 Å at a temperature of about 70° within one minute. Further, the etchant of the present invention etched the nitride layer at a relatively low temperature to avoid damage to the substrate.

The etchant of the present invention effectively removed the nitride layer in a short time so that efficiency of the removing process may be improved. The etchant of the present invention may also be employed in a process for removing the nitride layer that was formed on the bevel and the backside of the substrate, and for removing a dummy substrate used in a monitoring process. Further, since etched nitride might not remain in the etchant, the substrate might not be polluted by etched nitride.

According to the present invention, the etchant including hydrofluoric acid, phosphorous acid and deionized water is provided onto the substrate on which the nitride layer is formed. The etchant removes the nitride layer formed on the bevel and the backside of the substrate, and a dummy substrate used for process monitoring.

Accordingly, the etchant rapidly removes the nitride layer at a relatively low temperature so that the substrate is not damaged in the etching process. As a result, the substrate processed by the etchant may be reused so that the cost for manufacturing a semiconductor device is reduced.

Having described the preferred embodiments of the present invention, it is noted that modifications and variations can be made by persons skilled in the art in light of the above teachings. It is therefore to be understood that changes may be made in the particular embodiment of the present invention disclosed which is within the scope and the spirit of the invention outlined by the appended claims.

What is claimed is:

1. A method for removing a nitride layer of a semiconductor device, comprising:
   providing an etchant comprising about 15 to about 40 percent by volume of hydrofluoric acid, about 15 to about 60 percent by volume of phosphorous acid, and about 25 to about 45 percent by volume of deionized water;
   providing the etchant on a nitride layer formed on a bevel of a substrate at a temperature of about 50° C. to about 90° C. to remove the nitride layer;
   rinsing the substrate using deionized water; and
   drying the substrate.

2. The method of claim 1, wherein the etchant is sprayed on the nitride layer.

3. The method of claim 1, wherein the etchant is dropped on the nitride layer while the substrate rotates to spread the dropped etchant from a central portion of the substrate to an edge portion of the substrate by a centrifugal force generated from the rotative substrate.

4. The method of claim 1, wherein an amount of hydrofluoric acid is about 28 to about 40 percent by volume, and an amount of phosphorous is about 15 to about 35 percent by volume.

5. The method of claim 1, wherein the etchant is provided at a temperature of about 50° C. to about 75° C.

6. The method for removing a nitride layer of a semiconductor device comprising:
   providing an etchant comprising about 15 to about 40 percent by volume of hydrofluoric acid, about 15 to about 60 percent by volume of phosphorous acid, and about 25 to about 46 percent by volume of deionized water;
   providing the etchant onto a nitride layer formed on a backside of a substrate at a temperature of about 50° C. to about 90° C. to remove the nitride layer;
   rinsing the substrate using deionized water; and
   drying the substrate.

7. The method of claim 6, wherein the etchant is sprayed on the nitride layer.

8. The method of claim 6, wherein the substrate is immersed in the etchant.

9. The method of claim 6, wherein an amount of hydrofluoric acid is about 28 to about 40 percent by volume, and an amount of phosphorous acid is about 15 to about 35 percent by volume.

10. The method of claim 6, wherein the etchant is provided at a temperature of about 50° C. to about 75° C.

11. The method for removing a nitride layer of a semiconductor device comprising:
    providing an etchant comprising about 15 to about 40 percent by volume of hydrofluoric acid, about 15 to about 60 percent by volume of phosphorous acid, and about 25 to about 45 percent by volume of deionized water;
    providing the etchant onto a nitride layer formed on a front side of a substrate at a temperature of about 50° C. to about 90° C. to remove the nitride layer;
    rinsing the substrate using deionized water; and
    drying the substrate.

12. The method of claim 11, wherein the substrate is immersed in the etchant.

13. The method of claim 11, wherein an amount of hydrofluoric acid is about 28 to about 40 percent by volume, and an amount of phosphorous acid is about 15 to about 35 percent by volume.

14. The method of claim 11, wherein the etchant is provided at a temperature of about 50° C. to about 75° C.

* * * * *